United States Patent
Terada et al.

(10) Patent No.: US 7,168,321 B2
(45) Date of Patent: Jan. 30, 2007

(54) VIBRATION-TYPE PIEZOELECTRIC ACCELERATION SENSOR ELEMENT AND VIBRATION-TYPE PIEZOELECTRIC ACCELERATION SENSOR THEREWITH

(75) Inventors: Jiro Terada, Hirakata (JP); Takami Ishida, Osaka (JP); Masaya Nakatani, Takarazuka (JP); Masahiro Yasumi, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/182,098

(22) Filed: Jul. 15, 2005

(65) Prior Publication Data

US 2006/0236763 A1 Oct. 26, 2006

(30) Foreign Application Priority Data

Apr. 26, 2005 (JP) ............................. 2005-127417

(51) Int. Cl.
*G01P 15/09* (2006.01)
(52) U.S. Cl. .............................. 73/514.34; 73/514.29; 310/321; 310/348
(58) Field of Classification Search ............. 73/514.34, 73/514.29, 514.26, 514.36, 514.38; 310/321, 310/348
See application file for complete search history.

(56) References Cited

U.S. PATENT DOCUMENTS

| | | | | |
|---|---|---|---|---|
| 4,656,383 A | * | 4/1987 | Albert | 310/321 |
| 4,785,215 A | * | 11/1988 | Blech | 310/329 |
| 4,939,935 A | | 7/1990 | Amand | |
| 5,113,698 A | * | 5/1992 | Grlj et al. | 73/862.59 |
| 5,438,859 A | | 8/1995 | Yamashita et al. | |
| 5,501,103 A | * | 3/1996 | Woodruff et al. | 73/514.29 |
| 5,677,485 A | * | 10/1997 | Nakamura | 73/497 |
| 5,792,953 A | * | 8/1998 | Kaneko et al. | 73/514.15 |
| 5,948,982 A | | 9/1999 | Woodruff et al. | |

FOREIGN PATENT DOCUMENTS

| | | | |
|---|---|---|---|
| JP | 05-080075 | | 3/1993 |
| JP | 05-288771 | | 11/1993 |
| JP | 09-211020 | | 8/1997 |
| JP | 2004-251702 | * | 9/2004 |
| JP | 2005-140516 A | | 6/2005 |

* cited by examiner

*Primary Examiner*—Helen Kwok
(74) *Attorney, Agent, or Firm*—RatnerPrestia

(57) ABSTRACT

The vibration-type piezoelectric acceleration sensor element includes a frame; and a diaphragm, support, and retentive part, provided in the frame. The diaphragm includes a bottom electrode layer, a piezoelectric thin-film layer formed on the bottom electrode layer, and a top electrode layer formed on the piezoelectric thin-film layer. A first end of the diaphragm is connected to the frame. The support retains a second end of the diaphragm. The retentive part retains the support so that the support is reciprocable only in a direction through the first end and the second end of the diaphragm.

12 Claims, 5 Drawing Sheets

VIBRATION-TYPE PIEZOELECTRIC ACCELERATION SENSOR ELEMENT AND VIBRATION-TYPE PIEZOELECTRIC ACCELERATION SENSOR THEREWITH

TECHNICAL FIELD

The present invention relates to a vibration-type piezoelectric acceleration sensor element and a vibration-type piezoelectric acceleration sensor using the element, for measuring acceleration, controlling attitude of a moving subject, and a control system for a moving subject such as a vehicle.

BACKGROUND ART

FIG. 6 is a sectional view illustrating a makeup of a conventional acceleration sensor. At a part close to diaphragm 20 on the top surface of chip 1 formed with diaphragm 2, strain-sensitive resistors 3 are provided. The other part of the top surface of chip 1 is provided with a semiconductor integrated circuit for calculating acceleration, and thin-film resistor 4 for adjusting the characteristic of the integrated circuit thereon. Further, at a part including at least the top part of thin-film resistor 4, but excluding the top part of strain-sensitive resistors 3, protective film 5 is formed. Applying acceleration causes weight 6 made of glass to become stressed, changing the resistance of strain-sensitive resistors 3. Measuring this change enables detecting acceleration. Such an acceleration sensor is disclosed, for example, in Japanese Patent Unexamined Publication No. H05-288771.

FIG. 7 is a block diagram illustrating a makeup of another conventional acceleration sensor. This acceleration sensor includes piezoelectric element 11 for outputting signals corresponding to acceleration; converter 12 for converting the impedance of output signals; filter 13 for removing unnecessary signals; and amplifier 14 for amplifying necessary signals. The sensor further includes alternating current (AC) signal output part 16 for outputting AC signals synchronized with the cycle of timing signals being externally input. Between AC signal output part 16 and piezoelectric element 1, capacitor 17 is connected in series. The voltage signals output from the acceleration sensor are to be introduced to measurement/operation unit 18 and controller 15, both equipped with a microprocessor. Such an acceleration sensor is disclosed, for example, in Japanese Patent Unexamined Publication No. H05-80075.

In the above-mentioned makeup, strain-sensitive resistor 3 or piezoelectric element 11 detects acceleration. In such a method of detecting acceleration by means of a strain of a semiconductor resistor, the resistance changes by only a few percent and fluctuates largely. Besides, the resistance is influenced by the change in temperature of the signal process circuit, disabling precise detection of acceleration.

In addition, it is presumably difficult to detect the component for such as static gravity acceleration due to the detection structure. In other words, a makeup for detecting a variation in speed by means of a strain of a semiconductor resistor is unable to detect acceleration due to such as static gravity.

SUMMERY OF THE INVENTION

A vibration-type piezoelectric acceleration sensor element according to the present invention includes a frame; and a diaphragm, a support, and a retentive part, provided in the frame. The diaphragm includes a bottom electrode layer, a piezoelectric thin-film layer formed on the bottom electrode layer, and a top electrode layer formed on the piezoelectric thin-film layer. A first end of the diaphragm is connected to the frame. The support retains a second end of the diaphragm. The retentive part retains the support so that the support is reciprocable only in a direction through the first end and the second end of the diaphragm. This acceleration sensor element yields a high change rate with a resonance frequency owing to acceleration, and thus detects acceleration highly accurately, without being influenced by the temperature change. A vibration-type piezoelectric acceleration sensor according to the present invention includes the sensor element as described above, an amplifying circuit, and a detector. The frame of the sensor element is fixed. The amplifying circuit feeds a signal to the diaphragm, and amplifies charge excited from the piezoelectric thin-film layer of the diaphragm, the piezoelectric thin-film layer oscillating with the signal. The detector detects resonance frequency of a fundamental vibration of the diaphragm changing by expanding and contracting of the diaphragm due to applied acceleration.

DETAILED DESCRIPTION OF PREFERRED EMBODIMENTS

Figure 1:
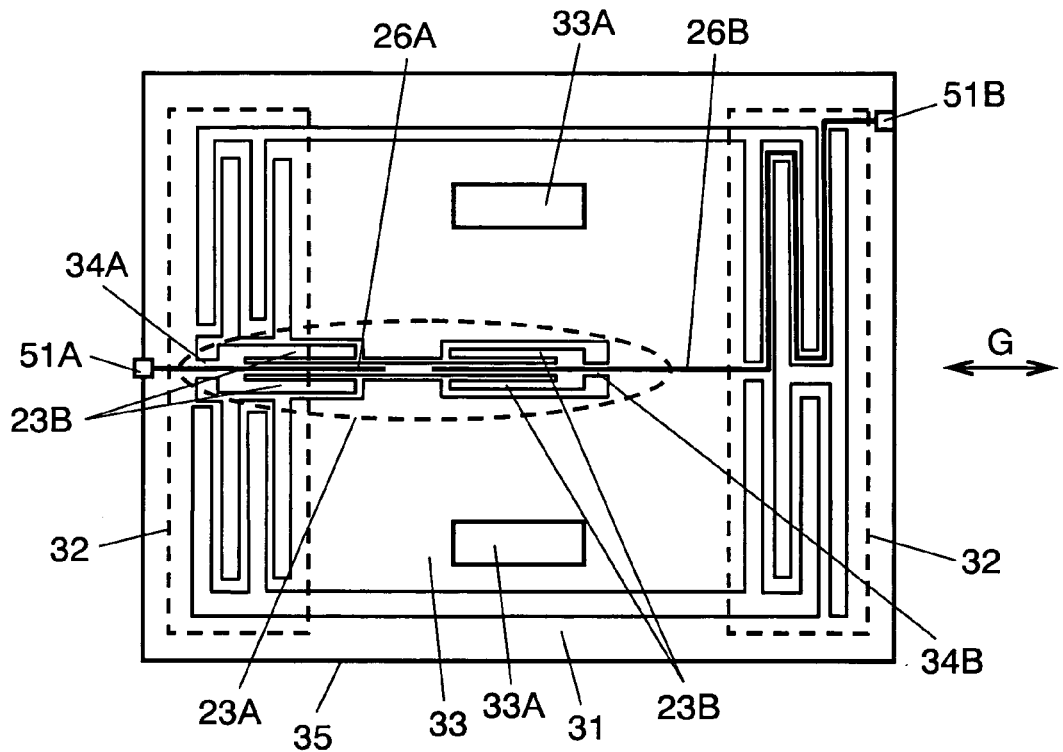
FIG. 1 is a top view illustrating a makeup of a vibration-type piezoelectric acceleration sensor element according to an embodiment of the present invention.
Figure 2:
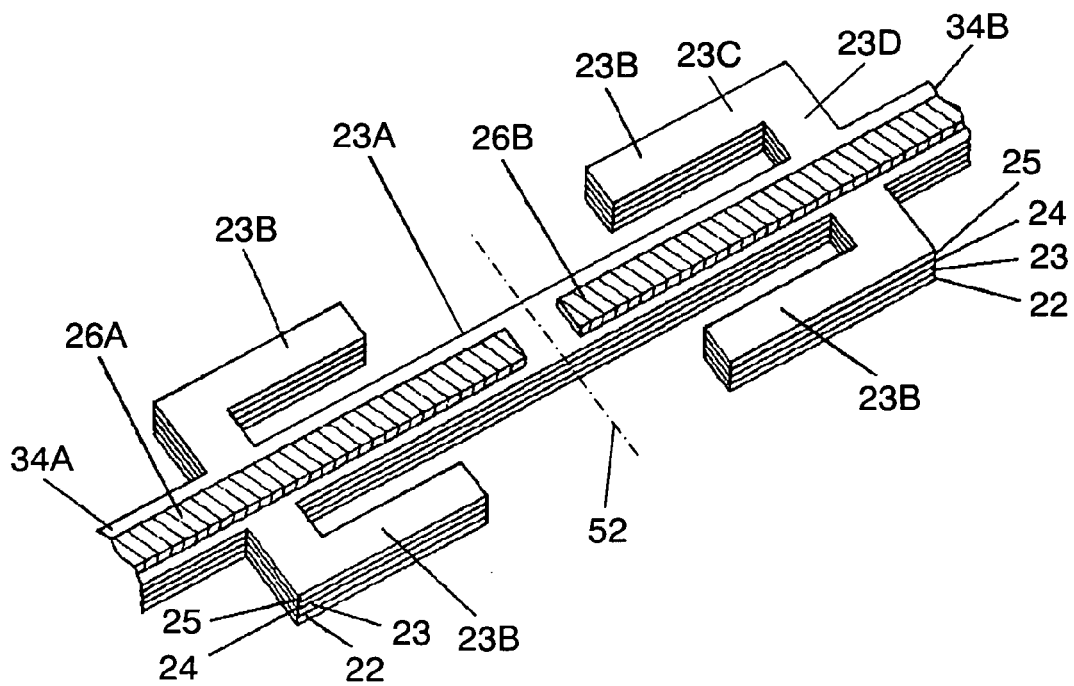
FIG. 2 is a perspective view illustrating a makeup of a diaphragm of the acceleration sensor element shown in FIG. 1.

FIG. 1 is a top view illustrating a makeup of a vibration-type piezoelectric acceleration sensor according to an embodiment of the present invention. FIG. 2 is a perspective view illustrating a makeup of a diaphragm in the acceleration sensor element.

Inside frame 31, diaphragm 23A having a fundamental vibration is provided. Support 33 retains diaphragm 23A and changes the fundamental vibration of diaphragm 23A. Retentive part 32 retains support 33. Both support 33 and retentive part 32 are also provided inside frame 31.

Diaphragm 23A having a beam-shape includes bases 34A and 34B facing each other, where base 34A (a first end) is retained so as to be hung by frame 31; base 34B (a second end), by support 33.

Support 33 is retained by frame 31 via retentive parts 32 at two positions on the right side, and one position on the left. In other words, Support 33 is retained by beam-shaped retentive parts 32 each having a zigzag-shaped spring structure. According to this configuration, support 33 moves reciprocably only in a direction through base 34A and base 34B of diaphragm 23A due to an acceleration applied in a horizontal direction of the page space as shown with arrow G. Namely, as support 33 is restrained so as to move reciprocably only in a horizontal direction of the page space, support 33 moves reciprocably only in a direction through base 34A and base 34B. Diaphragm 23A is subjected to the action of an expansion and contraction force parallel to the reciprocating motion of support 33. Thus, when diaphragm 23A is subjected to the action of an expansion and contraction force due to the acceleration, diaphragm 23A expands and contracts in a direction parallel to the movement of support 33. The vibration-type piezoelectric acceleration sensor element (hereinafter, abbreviated as "element") 35 in this makeup expands and contracts diaphragm 23A with a high responsivity and high sensitivity by acceleration, and thus detects acceleration with a high responsivity and high accuracy, without being influenced by the temperature change.

Here, providing weight 33A to add mass to support 33 further raises the sensitivity (conversion efficiency). In other words, the displacement magnitude of support 33 due to acceleration increases, and diaphragm 23A expands and contracts proportionally, allowing acceleration to be detected with a high sensitivity.

A pair of arms 23B are provided for increasing the resonance sharpness of diaphragm 23A. Arms 23B increase the resonance sharpness by at least approximately two to three times, improving the detection accuracy. Each of Arms 23B includes parallel part 23C parallel with the direction through base 34A and base 34B, and connection part 23D perpendicular to parallel part 23C and connected to diaphragm 23A. Arms 23B are provided symmetrically with respect to diaphragm 23A. Here, as shown in FIG. 2, two pairs of arms 23B are desirably provided symmetrically with respect to central axis 52 orthogonal to and bisecting diaphragm 23A.

In addition, as shown in FIG. 2, diaphragm 23A includes silicon (Si) layer 23 formed on silicon dioxide ($SiO_2$) layer 22, bottom electrode layer 24 formed on Si layer 23, and piezoelectric thin-film layer 25 formed on bottom electrode layer 24. Diaphragm 23A further includes drive electrode layer 26B as a first top electrode layer and detection electrode layer 26A as a second top electrode layer, both formed on piezoelectric thin-film layer 25. Still, drive electrode layer 26B and detection electrode layer 26A are formed along a beam-like central part composing diaphragm 23A, all the way to frame 31, as shown in FIG. 1. In this makeup, the central part of retentive part 32 vibrates with the minimum amplitude, does not generate an electromotive force due to displacement, the signals for modulating to the resonance frequency of diaphragm 23A is resistant to being superimposed, and thus the signals of only the resonance frequency for diaphragm 23A are detected.

Further, drive electrode layer 26B and detection electrode layer 26A are desirably provided with terminal electrodes 51A and 51B at a predetermined part extending to frame 31, and are connected to a control circuit (not illustrated). In other words, drive electrode layer 26B and detection electrode layer 26A, both top electrode layers, extend to the outer edge of frame 31 along a beam-like central part of retentive part 32. Providing terminal electrodes 51A and 51B on frame 31 that does not vibrate in this way, does not influence the vibration of diaphragm 23A, allowing acceleration to be detected with high accuracy, without being influenced by the temperature change.

Retentive part 32 desirably retains support 33 with a zigzag, beam-like spring as shown in FIG. 1. This causes diaphragm 23A to expand and to contract with a high responsivity and sensitivity by acceleration.

Further, drive electrode layer 26B and detection electrode layer 26A are desirably formed so as to be symmetrical with respect to central axis 52. This allows driving by diaphragm 23A and detecting from diaphragm 23A in the equally divided effective area of diaphragm 23A, improving the detection sensitivity.

Figure 3:
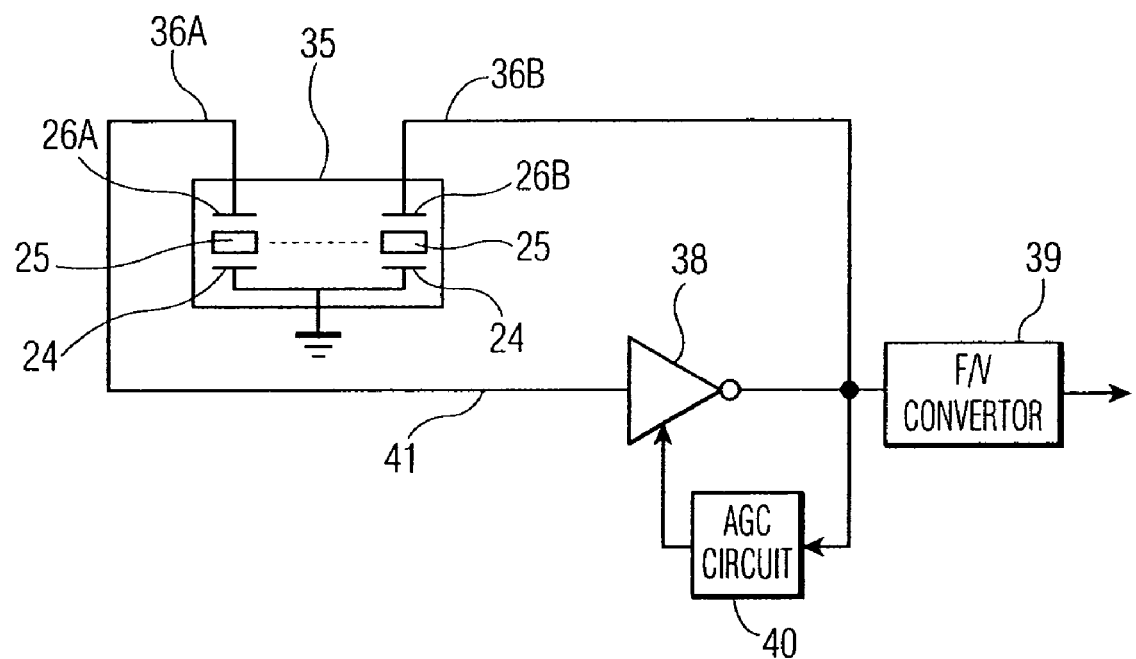
FIG. 3 is a schematic diagram illustrating a makeup of an acceleration sensor according to the embodiment of the present invention.

Next, a description is made for the operation of element 35. FIG. 3 is a schematic diagram illustrating a makeup of a vibration-type piezoelectric acceleration sensor according to this embodiment of the present invention.

In element 35, detection signal line (hereinafter, abbreviated as "line") 36A and drive signal line (hereinafter, abbreviated as "line") 36B are connected to detection electrode layer 26A and drive electrode layer 26B, respectively. Amplifying circuit 38 amplifies feeble signals, and also drives diaphragm 23A of element 35 shown in FIG. 2. Frequency/voltage (F/V) converter 39 converts the frequencies of input signals to voltage. Automatic gain control (AGC) circuit 40 controls the voltage level of output signals from amplifying circuit 38.

Element 35 is mounted in vibration-type piezoelectric acceleration sensor (hereinafter, abbreviated as "sensor") 41, with frame 31 retained. When sensor 41 is supplied with power, a certain signal such as a noise is input to amplifying circuit 38 to be amplified. The amplified signal is fed to drive electrode layer 26B through line 36B to vibrate diaphragm 23A in a thickness direction thereof. Consequently, charge is excited from piezoelectric thin-film layer 25 to detection electrode layer 26A, a signal is input from detection electrode layer 26A to amplifying circuit 38 through line 36A and the signal is amplified. Then, this closed-loop operation is repeated until element 35 enters a stable, steady state at the resonance frequency for the fundamental vibration. The resonance frequency signal for the fundamental vibration is input to F/V converter 39 to be converted to a predetermined voltage. F/V converter 39 functions as a detector for detecting the resonance frequency for the fundamental vibration of diaphragm 23A in the thickness direction thereof, the resonance frequency changes owing to expanding and contracting of diaphragm 23A due to the applied acceleration. AGC circuit 40 controls F/V converter 39 to operate accurately when the voltage output from amplifier 38 rises to cause strains in the signals.

When acceleration is applied externally, support 33 receives an inertial force caused by a reciprocable motion along a direction through bases 34a and 34B, and this reciprocable motion causes diaphragm 23A oscillating in a steady state to expand and contract. Accordingly, the resonance frequency for the fundamental vibration of diaphragm 23A changes, which is detected according to acceleration. In this makeup, applying acceleration yields a high change rate for a resonance frequency, allowing acceleration to be detected with high accuracy, without being influenced by the temperature change.

Next, a description is made for a method of manufacturing element 35. FIGS. 4A through 4F are sectional views illustrating a method of manufacturing a vibration-type piezoelectric acceleration sensor element according to this embodiment of the present invention. Here, these figures omit showing the detailed shape of diaphragm 23A.

Figure 4A:
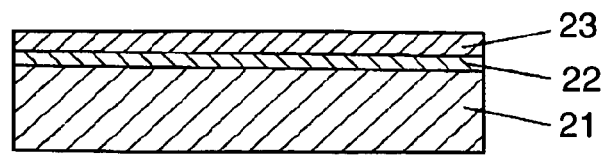
FIGS. 4A through 4F are sectional views illustrating a method of manufacturing the acceleration sensor element shown in FIG. 1.

As shown in FIG. 4A, form etching stopper 22 made of $SiO_2$ to stop etching on substrate 21 made of Si, and also Si layer 23 on etching stopper 22. For example, the thickness of substrate 21 is to be 20 μm; etching stopper 22, 2 μm; Si layer 23, 300 μm.

Figure 4B:
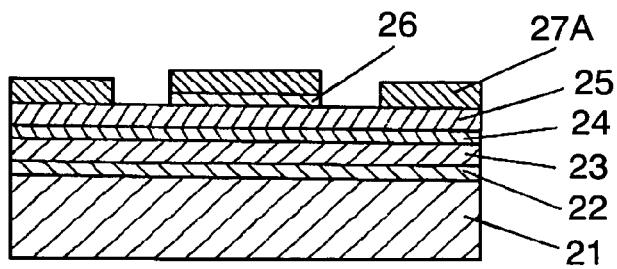

Next, as shown in FIG. 4B, form titanium (Ti) with a thickness of 5 nm, on Si layer 23 using high-frequency sputtering, and further platinum with a thickness of 0.2 µm, to form bottom electrode layer 24. Then, on this platinum, form piezoelectric thin-film layer 25 made of lead zirconate titanate (PZT) with a thickness of 2.5 µm. Further, form a Ti layer with a thickness of 10 nm on piezoelectric thin-film layer 25 using a metal mask with vapor deposition so that the Ti layer has a predetermined pattern. In the same way, on this Ti layer, form gold with a thickness of 0.3 µm with vapor deposition to form top electrode layer 26 with a predetermined pattern. Forming piezoelectric thin-film layer 25 with PZT yields a high change rate with a resonance frequency due to acceleration, allowing acceleration to be detected with high accuracy, without being influenced by the temperature change.

Figure 4C:
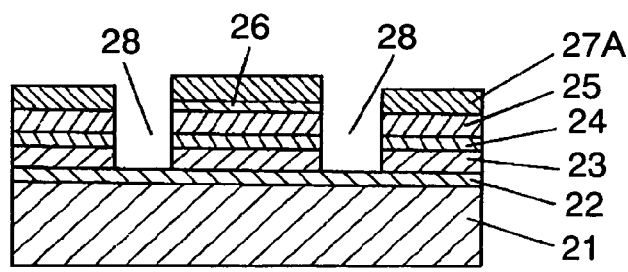

Next, after forming resist 27A as an etching mask at a part other than a portion where lateral groove 28 will be provide in FIG. 4C, on such as the gold part of top electrode layer 26, form lateral groove 28 with etching as shown in FIG. 4C. Here, besides diaphragm 23A, including Si layer 23 in support 33 and retentive part 32 improves the stability of the change in resonance frequency corresponding to a stress occurring in diaphragm 23A due to the change in the applied acceleration.

Figure 4D:
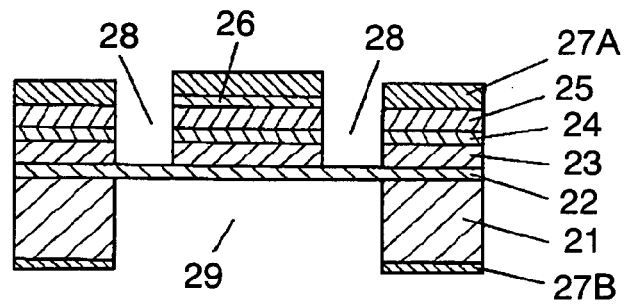
Figure 4E:
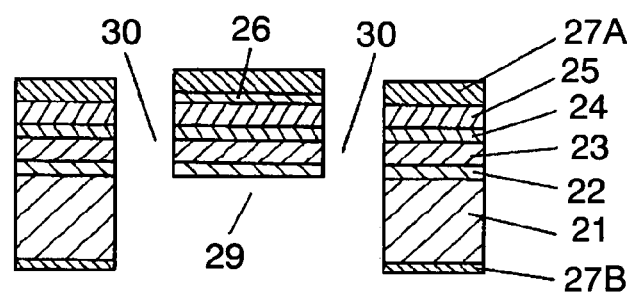
Figure 4F:
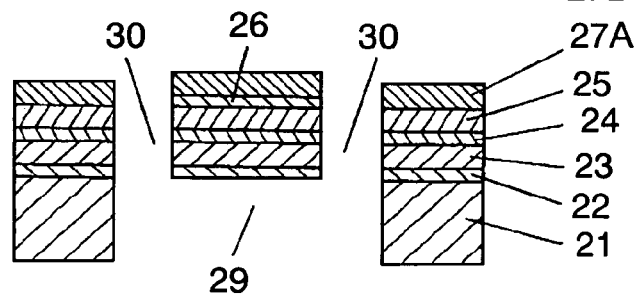

Next, as shown in FIG. 4D, form resist 27B with a predetermined pattern on the backside of substrate 21, and etch the backside of substrate 21, to form hole 29. Then as shown in FIG. 4E, etch again from the side of resist 27A to form side hole 30. Further, remove resist 27B, and as shown in FIG. 4F, form diaphragm 23A in a thin and beam-like form. Finally, remove resist 27A. In this way, element 35 including diaphragm 23A is formed.

Figure 5:
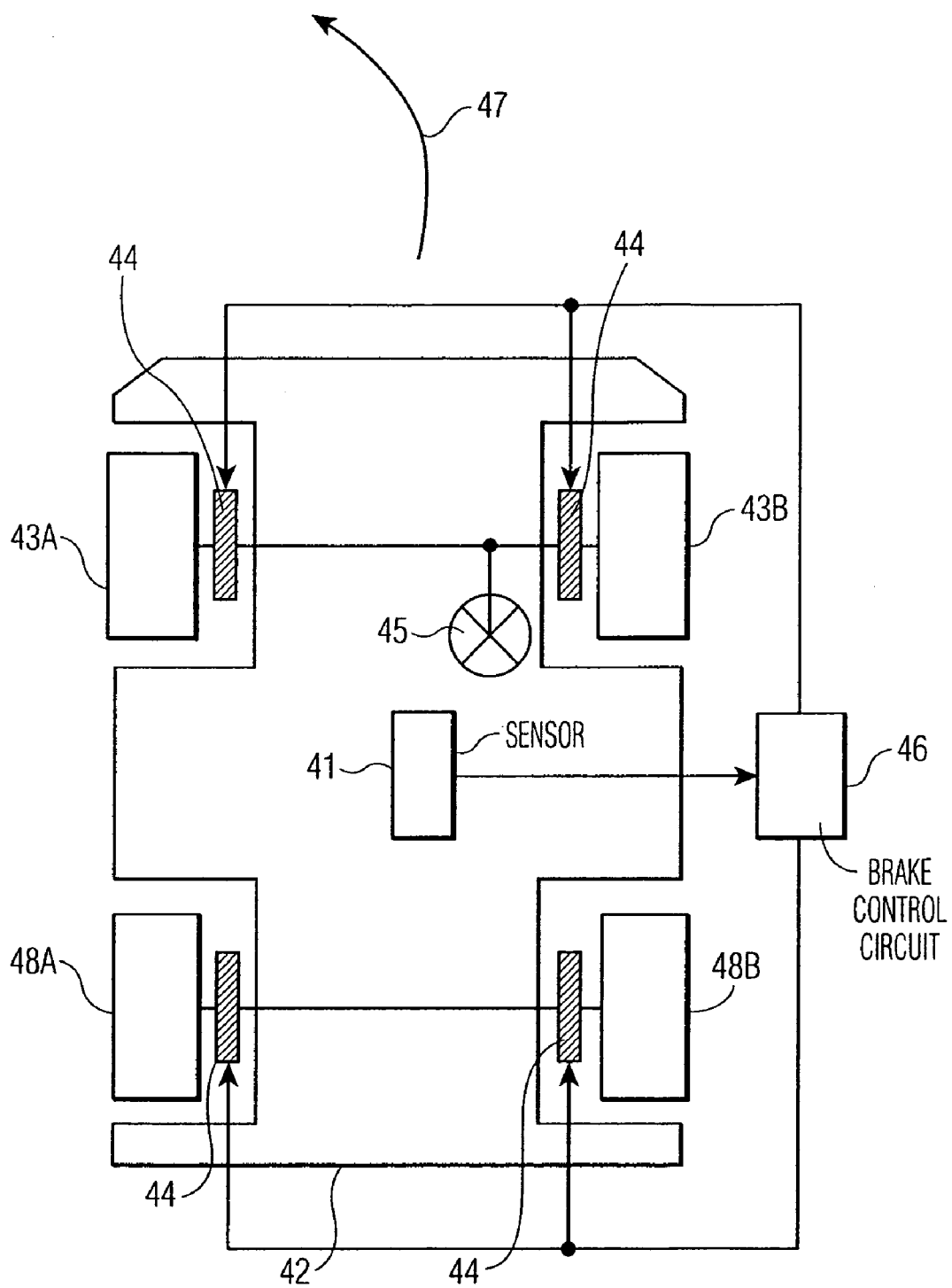
FIG. 5 is a schematic diagram illustrating a brake control system using the acceleration sensor shown in FIG. 3.
Figure 6:
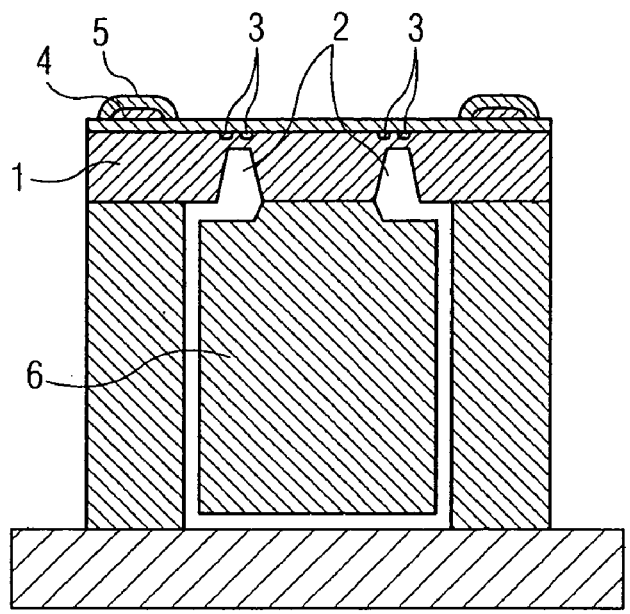
FIG. 6 is a sectional view illustrating a makeup of a conventional acceleration sensor.
Figure 7:
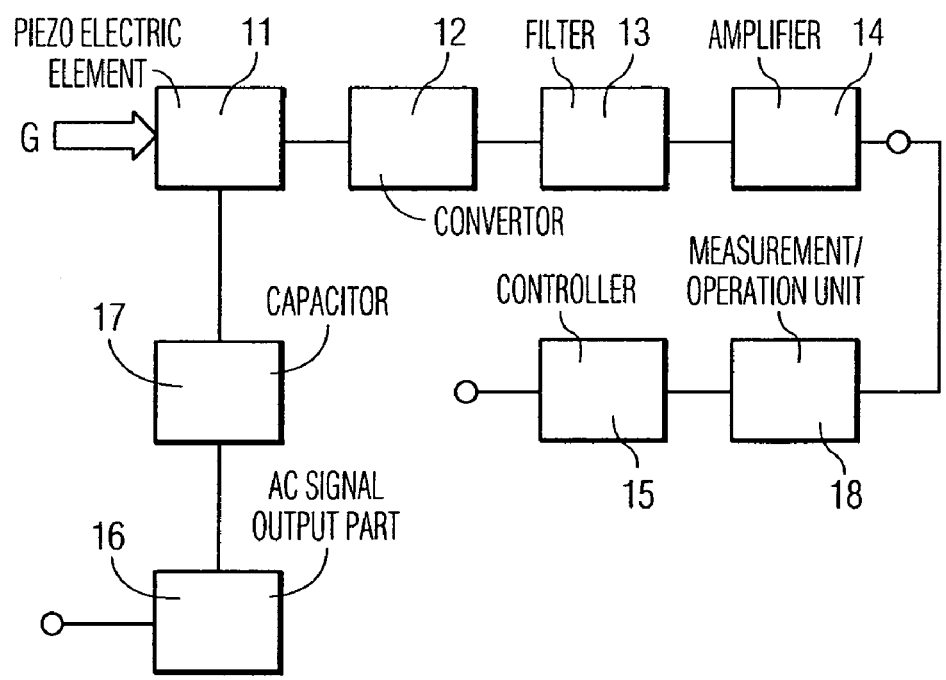
FIG. 7 is a block diagram illustrating a makeup of another conventional acceleration sensor.

Next, a description is made for an application example using a vibration-type piezoelectric acceleration sensor according to the present invention. FIG. 5 is a schematic diagram of a brake control system using a vibration-type piezoelectric acceleration sensor according to the embodiment. On automobile body 42, front wheels 43A and 43B, rear wheels 48A and 48B, braking devices 44, steering wheel 45, and brake control circuit (hereinafter, abbreviated as "controller") 46 are mounted. Automobile body 42 is traveling in traveling direction 47.

Sensor 41 detects acceleration and controller 46 processes the output signals for the acceleration and transmits the processed signals to braking devices 44. Controller 46 controls so that front wheels 43A and 43B, and rear wheels 48A and 48B do not lock due to braking devices 44, enabling safe driving control. For example, turning steering wheel 45 to the left as shown by traveling direction 47 makes automobile body 42 turn to the left. In this case, controller 46 changes the effectiveness of the brakes for front wheel 43B and rear wheel 48B, which are on the outer edge of the tires in the rotating traveling direction, and front wheel 43A and rear wheel 48A, which are on the inner edge. This prevents an accident due to skids of the tires, controlling automobile body 42 in safety.

Here, the acceleration received by sensor 41 slightly varies depending on the position where sensor 41 is mounted on automobile body 42. Therefore, sensor 41 is desirably arranged in the center of automobile body 42 with the objective of detecting average acceleration. Sensor 41 is desirably arranged so that the lateral direction of automobile body 42 agrees with the direction through bases 34A and 34B, namely the acceleration-detecting direction of sensor element 35 incorporated in sensor 41.

As mentioned above, a vibration-type piezoelectric acceleration sensor element and vibration-type piezoelectric acceleration sensor according to the present invention are used for detecting gravity on earth as static acceleration, for such as a safety brake system. In addition, the sensor can be used for detecting an angle of inclination, by detecting static acceleration. Further, the sensor detects an angle of inclination to be applied to a three-dimensional navigation apparatus including a capability of handling altitude.

What is claimed is:

1. A vibration-type piezoelectric acceleration sensor element comprising:
    a frame;
    a diaphragm provided in the frame, the diaphragm having a first end thereof being connected to the frame and a second end facing the first end, the diaphragm having an axis extending through the first end and the second end, the diaphragm including:
        a bottom electrode layer;
        a piezoelectric thin-film layer formed on the bottom electrode layer; and
        a top electrode layer formed on the piezoelectric thin-film layer;
    a support provided in the frame and retaining the second end of the diaphragm; and
    a retentive part provided on opposite sides of the frame and oriented such that the axis intersects the retentive part, the retentive part retaining the support such that movement of the support is reciprocable only in a direction parallel to the axis.

2. The vibration-type piezoelectric acceleration sensor element according to claim 1,
    wherein the vibration-type piezoelectric acceleration sensor element detects acceleration by changing a fundamental vibration of the diaphragm, the diaphragm expanding and contracting in the direction parallel to the axis due to vibration propagating through the support via the retentive part.

3. The vibration-type piezoelectric acceleration sensor element according to claim 1, wherein the retentive part includes a spring having a zigzag, beam-like form.

4. The vibration-type piezoelectric acceleration sensor element according to claim 1, wherein the diaphragm, the support, and the retentive part are formed from silicon.

5. The vibration-type piezoelectric acceleration sensor element according to claim 1, wherein the piezoelectric thin-film layer is made of lead zirconate titanate.

6. The vibration-type piezoelectric acceleration sensor element according to claim 1 further comprising a weight for adding mass to the support.

7. The vibration-type piezoelectric acceleration sensor element according to claim 1, wherein the top electrode layer extends to an outer edge of the frame along the retentive part.

8. The vibration-type piezoelectric acceleration sensor element according to claim 1, wherein
    the top electrode layer includes a first top electrode layer for driving the diaphragm and a second top electrode layer for detecting a signal from the diaphragm, and
    the diaphragm has a beam-like form, and the respective first and second top electrode layers are symmetric with respect to a central axis that bisects the diaphragm and is orthogonal to the axis extending through the first end and the second end.

9. The vibration-type piezoelectric acceleration sensor element according to claim 8, further comprising first and second terminal electrodes, connected to the first and the second top electrode layers, respectively, the first and the second terminal electrodes provided on the frame.

10. The vibration-type piezoelectric acceleration sensor element according to claim 1, further comprising a pair of arms, each of the arms having:
   a parallel part parallel with the axis extending through the first end and the second end; and
   a connection part perpendicular to the parallel part and connecting the parallel part to the diaphragm.

11. The vibration-type piezoelectric acceleration sensor element according to claim 10,
   wherein the pair of arms is one of two pairs of arms, each of the two pairs of arms is provided symmetrical with respect to a central axis bisecting the diaphragm and orthogonal to the axis extending through the first end and the second end.

12. A vibration-type piezoelectric acceleration sensor comprising:
   1) a vibration-type piezoelectric acceleration sensor element having:
      a fixed frame;
      a diaphragm provided in the frame, the diaphragm having a first end thereof being connected to the frame and a second end facing the first end, the diaphragm having an axis extending through the first end and the second end, the diaphragm including:
         a bottom electrode layer;
         a piezoelectric thin-film layer formed on the bottom electrode layer; and
         a top electrode layer formed on the piezoelectric thin-film layer;
      a support provided in the frame and retaining the second end of the diaphragm; and
      a retentive part provided on opposite sides of the frame, and oriented such that the axis intersects the retentive part, the retentive part retaining the support such that movement of the support is reciprocable only in a direction parallel to the axis;
   2) an amplifying circuit for feeding a signal to the diaphragm and amplifying a charge excited from the piezoelectric thin-film layer of the diaphragm, the piezoelectric thin-film layer oscillating with the signal; and
   3) a detector for detecting a resonance frequency of a fundamental vibration of the diaphragm, the diaphragm expanding and contracting due to an applied acceleration.

* * * * *